United States Patent [19]

Dupraz

[11] Patent Number: 4,797,607
[45] Date of Patent: Jan. 10, 1989

[54] METHOD OF UPDATING THE SCALE FACTOR OF APPARATUS FOR MEASURING AN ALTERNATING ELECTRIC CURRENT BY MEANS OF THE FARADAY EFFECT

[75] Inventor: Jean-Pierre Dupraz, Aix les Bains, France

[73] Assignee: Alsthom, Cedex, France

[21] Appl. No.: 179,805

[22] Filed: Apr. 11, 1988

[30] Foreign Application Priority Data

Apr. 10, 1987 [FR] France ................................ 87 05103

[51] Int. Cl.$^4$ ............................................ G01R 31/00
[52] U.S. Cl. ................................... 324/96; 324/117 R
[58] Field of Search ............. 324/117 R, 96; 350/355, 350/356; 455/610, 612

[56] References Cited

U.S. PATENT DOCUMENTS

| | | | |
|---|---|---|---|
| 3,769,584 | 10/1973 | Iten et al. | 324/96 |
| 4,370,612 | 1/1983 | Puech | 324/96 |
| 4,378,497 | 3/1983 | Gaillorenzi | 324/96 |
| 4,442,350 | 4/1984 | Rashleigh | 324/96 |
| 4,477,723 | 10/1984 | Carome | 324/96 |
| 4,533,829 | 8/1985 | Miceli | 324/96 |
| 4,542,338 | 9/1985 | Arditty | 324/96 |
| 4,591,786 | 5/1986 | Koo et al. | 324/96 |
| 4,603,296 | 7/1986 | Koo et al. | 324/96 |
| 4,644,273 | 2/1987 | Bobb | 324/96 |
| 4,683,421 | 7/1987 | Miller | 324/96 |
| 4,748,686 | 5/1988 | Glomb | 324/96 |

FOREIGN PATENT DOCUMENTS

0004321 10/1979 European Pat. Off. .
2042558 12/1971 Fed. Rep. of Germany .
2461956 2/1981 France .

*Primary Examiner*—Michael J. Tokar
*Attorney, Agent, or Firm*—Sughrue, Mion, Zinn, Macpeak & Seas

[57] ABSTRACT

The method is intended for use in a step-down high tension current measuring apparatus using the Faraday effect and including a Sagnac interferometer having an optical loop constituted by a fiber (47) surrounding the high tension conductor (11) conveying the alternating current to be measured and terminating at an integrated optical circuit (43) which delivers an output light beam to an electronic circuit with the optical power of the light beam having a component in its spectrum at a frequency which is a sinusoidal function of the phase difference generated by the Faraday effect, with the coefficient of proportionality being referred to as a scale factor. The method consists in periodically updating the scale factor used for interpreting measurements on the basis of D.C. components in the output signal from the interferometer which appear in response to two successive disturbances which modify the Faraday effect and which are caused by means of a test direct current taking two different successive values and applied to auxiliary coils (44, 45).

4 Claims, 4 Drawing Sheets

METHOD OF UPDATING THE SCALE FACTOR OF APPARATUS FOR MEASURING AN ALTERNATING ELECTRIC CURRENT BY MEANS OF THE FARADAY EFFECT

REFERENCE TO RELATED APPLICATION

This application relates to application Ser. No. 179,785, filed Apr. 11, 1988, entitled "A DEVICE FOR MEASURING ELECTRIC CURRENT BY THE FARADAY EFFECT IMPLEMENTED IN A SAGNAC INTERFEROMETER" by the same applicant and assigned to the common assignee.

The present invention relates to measuring alternating electric currents and is especially applicable to grids for transporting and distributing electrical power, where using the Faraday effect (which relies on a light wave) avoids the need to place electrical conductors of a measuring circuit in the immediate proximity of high tension.

BACKGROUND OF THE INVENTION

The Faraday effect is a magneto-optical effect resulting from interaction between an electromagnetic wave and a material medium in the presence of a magnetic field.

When subjected to a magnetic field in the same direction as the electromagnetic wave, some material mediums present optical activity in the form of induced, non-reciprocal circular birefringence, i.e. by propagation speeds in the medium which are different for righthand and lefthand circular polarization.

Implementing the Faraday effect for measuring an electric current is done either by means of a linearly polarized light wave which may be considered as being the sum of two circularly polarized light waves, one having righthand polarization and the other lefthand polarization, with the phase shift in the direction of the polarization plane being measured by polarimetric or interferometric techniques, or else by means of two counter-propagating light waves which are both circularly polarized in the same lefthand or righthand direction and with the phase shift being measured by the so-called Sagnac interferometric technique.

In both cases, i.e. a single linearly polarized light wave or two counter-propagating circularly polarized light waves, the phase shift angle $\delta\Phi$ due to the Faraday effect is proportional to the instantaneous value I of the current to be measured, with a coefficient of proportionality $k1$ referred to herein as the Faraday effect efficiency factor:

$$\delta\Phi = k1\, I = a\, V N I$$

where $a$ is equal to 1 for a linearly polarized wave and to 2 for counter-propagating circularly polarized waves, V being the Verdet constant, and N being the number of turns travelled by the light waves around the conductor carrying the current to be measured.

Interferometric techniques which make use of beats between two light waves give rise to a signal at the output from a photodetector which is a cosine function of the instantaneous current to be measured since it is proportional to the light power P which results from adding two light waves, as given by:

$$P = P1 + P2 + 2\sqrt{P1.P2}\cos\delta\Phi$$

(where P1 and P2 are the respective optical powers to the two light waves), in other words:

$$P = P1 + P2 + 2\sqrt{P1.P2}\cos k1I$$

This output signal can be written in the general form:

$$k_0 + k_2'\cos k1I$$

where $k_0$ is a constant and $k2'$ is a coefficient called the scale factor. This gives rise to a variation law having zero sensitivity in the small current range which, in practice, is the range where highest accuracy is sought. In order to avoid this drawback, attempts have been made to modify the interferometry conditions in order to obtain an output signal which obeys a sine law.

For further detail, reference may be made to French patent application No. FR-A-2 461 956 which describes measuring apparatus for measuring an electric current by the Faraday effect and implemented in a Sagnac interferometer having an output signal with a component whose amplitude is a sine function of the instantaneous value of the current to be measured. This property in the output signal is obtained by modulating the phase shift angle between the two counter-propagating light waves running round the interferometer loop, thereby giving rise to birefringence phenomena in the interferometer which are either non-reciprocal (by modulating a current flowing through an auxiliary winding) or else are reciprocal but pulsed at half the resonance frequency of the interferometer loop (referred to as the natural frequency of the interferometer), so as to give rise to instantaneous phase differences which are equal but opposite in sign on the two counter-propagating waves by means of the elasto-optical effect or of the elasto-acoustic effect.

The addition of these birefringence phenomena (whether they be reciprocal or not) has the effect of transforming the expression for the light power P given by the two light waves leaving the interferometer, as follows:

$$P = P1 + P2 + \sqrt{P1.P2}\cos[\delta\Phi + 2\alpha\cos(2\pi ft + \beta)]$$

This light power P has a frequency spectrum which is rich in components, and in particular it includes:

a direct component;

a component at the modulation frequency f proportional to $\sin\delta\Phi$ and having maximum variation in the small current range; and a component at twice the modulation frequency f which is proportional to $\cos\delta\Phi$ and which cancels with the current to be measured.

The component of the frequency f in the output signal from the interferometer is separated from the others and is synchronously demodulated in order to give a signal having the form:

$$k2\sin(k1\,I)$$

where $k2$ is a new scale factor. This scale factor $k2$ suffers, as does the preceding scale factor $k2'$, from the drawback of being sensitive to drift in the various components in the measurement chain, and in particular to variations in the light power emitted by the light source delivering the beam from which the two counter-propagating waves running through the interferometer loop are derived, thereby giving rise to considerable inaccuracy in the measurement.

In order to solve this difficulty, proposals are made in the above-mentioned French patent to use a zero method by subjecting the interferometer loop to a reference magnetic field generated by an auxiliary coil carrying a reference current which can be adjusted in such a manner as to compensate for the phase shift δΦ induced by the Faraday effect on the current to be measured.

This zero method suffers from the drawback of being very difficult to implement in current measuring step-down apparatus for use with high tension currents to be measured because of the difficulty in making the auxiliary coil. The product of the number of optical fiber turns multiplied by the number of electrical conductor turns in said auxiliary coil is proportional to the step-down ratio which must exist between the current to be measured and the reference current, which ratio is of the order of 100,000.

The object of the present invention is to remedy measurement inaccuracy due to drift in the scale factor without using a zero method, in order to make it possible to make step-down measurement apparatus for measuring high tension current at a price which is not prohibitive.

SUMMARY OF THE INVENTION

The present invention provides a method of updating the scale factor of a current measuring apparatus for measuring an alternating electrical current by means of the Faraday effect implemented in an interferometer which delivers an output light beam whose optical power includes a frequency spectrum component or "ray" which is proportional, by a scale factor k2, to the sine or the cosine of the phase difference generated by the Faraday effect on the light waves travelling through the interferometer, said phase difference itself being proportional to the instantaneous value of the current to be measured as multiplied by a Faraday effect efficiency factor k1, said light beam being received by a photodetector and said component being extracted therefrom by associated electronics in order to constitute an output signal s(t) from the interferometer, said method consisting in:

determining the peak value $I1$ of the alternating current to be measured from the output signal s(t) from the interferometer, from the value k1 of the Faraday effect efficiency coefficient for the alternating current to be measured and the available value k2 of the scale factor;

causing two successive disturbances of different amplitudes by adding an auxiliary Faraday effect to the Faraday effect due to the alternating current to be measured, said auxiliary Faraday effect being generated by a test direct current which successively takes on two distinct values I21 and I22 which are different from zero and which are applied with a Faraday effect efficiency factor k3;

storing the direct components so1 and so2 of the output signal from the interferometer in response to the above two disturbances; and adopting a new scale factor k2 given by the expression:

$$(so1 - so2)/(J0(k1.I1)[\sin(k3\ I21) - \sin(k3\ I22)])$$

where J0 is the zero order Bessel function of the first kind.

Preferably, this method is made use of only during periods during which the alternating current to be measured is sufficiently small for the angular phase difference k1 I1 it produces by the Faraday effect to be no greater than about 10°.

Some apparatuses for measuring alternating current by the Faraday effect include a modulated light wave interferometer delivering an output light beam whose optical power has a modulation spectrum including a ray at a frequency greater than that of the alternating current to be measured, said ray having an amplitude which is proportional to the sine of the phase difference due to the Faraday effect with the coefficient of proportionality being referred to as a scale factor, and being extracted at the output from a photodetector by an associated electronic circuit for providing the output signal from the interferometer. In such apparatuses, it is advantageous in the scale factor updating method, and more generally whenever determining the current to be measured, to discontinue the modulation periodically in order to cause the ray giving rise to the interferometer output signal to disappear, and to use the residual value of said output signal as a correction term for the zero drift in the output signal from the interferometer.

BRIEF DESCRIPTION OF THE DRAWINGS

An implementation of the invention is described by way of example with reference to the accompanying drawings, in which.

MORE DETAILED DESCRIPTION

The apparatus described below is intended for use in measuring alternating electrical current in high tension equipment.

Figure 1:
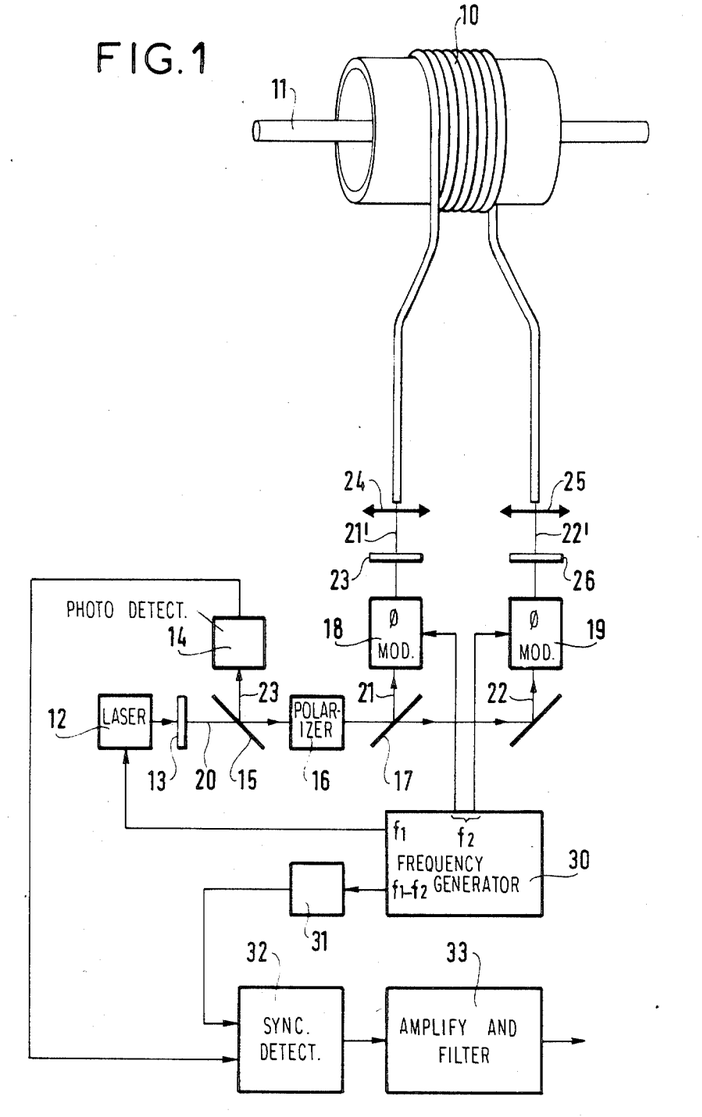
FIG. 1 is a block diagram of apparatus for measuring an alternating current and implementing the method in accordance with the invention.

The theoretical diagram is given in FIG. 1. A monomode optical fiber 10 having high circular birefringence is wound one or more times around an electrical conductor 11 conveying an alternating current I1 sin wt which is to be measured. A source of coherent light 12 emits a linearly polarized light beam 20 whose polarization can be adjusted in angle by means of a half-wave plate 13. This linearly polarized beam passes through a beam splitter 15, then a polarizer 16, and is then split by a beam splitter 17 into two light waves 21 and 22 each having linear polarization.

The light wave 21 passes through a phase modulator 18, and then a quarter-wave plate 23, thereby giving rise to a light wave 21' having circular polarization which is injected into the optical fiber 10 by means of a lens 14, and which, after propagating around the conductor 11, emerges from the optical fiber 10 via another lens 25 and passes through a quarter-wave plate 26 disposed in such a manner as to re-establish linear polarization, in an identical plane of polarization as that of the beams 21 and 22, in the absence of any Faraday effect. After leaving the quarter-wave plate 26, the beam passes through a phase modulator 19 which is controlled to operate in anti-phase relative to the modulator 18, and it then passes through the beam splitter 17, and the polarizer 16, prior to being reflected by the beam splitter 15 to the sensitive surface of a photodetector 14.

The light wave 22 follows the same path but in the opposite direction, in other words it passes in succession through the modulator 19, the quarter-wave plate 26, the fiber 10, the quarter-wise plate 23, the modulator 18, is reflected on the beam splitter 17, passes through the polarizer 16, and finally, after being reflected by the beam splitter 15, it reaches the photodetector 14 where it interferes with the above-mentioned light wave.

The single beam 20 has thus given rise to two circularly polarized waves both of which are righthanded or lefthanded as the case may be and which take one or more trips around the conductor 1 in opposite directions in a material medium constituted by the optical fiber 10.

The optical fiber 10 is made in such a way as to ensure firstly that it has very high circular birefringence, and secondly to be insensitive to mechanical vibration. This is obtained by twisting the fiber about itself and in coating it with a silicone gell. The radii of curvature of the fiber are as large as possible in order to minimize the linear birefringence effects associated with curvature stress. The optical components other than the optical fiber 10 are physically located on a compact optical support placed away from the high potential of the current to be measured. The optical fiber 10 constitutes a continuous propagation medium having no connections or welds, and suitable for conserving circular polarization well both around the electrical conductor whose current is to be measured and on the path between the conductor and the optical support.

The current I1 sin wt carried by the conductor 11 gives rise to non-reciprocal birefringence in the optical fiber 10 such that the counter-propagating light waves are subjected to a relative phase shift $\delta\Phi$ proportional to the current, i.e.:

$$\delta\Phi = k1 \, I1 \sin wt$$

These two beams interfere at the optical detector 14 and deliver maximum optical power in the absence of electrical current and in the absence of modulation since both of them then follow identical optical paths.

The phase modulators 18 and 19 are controlled in antiphase by a sinusoidally varying voltage at a frequency f2 selected to be as close as possible to the natural frequency of the interferometer, but without exceeding it.

In this way, the modulators 18 and 19 give rise at any instant to equal phase shifts of opposite sign and periodic amplitude in the two counter-propagating waves, and these shifts are added to the phase shift $\delta\Phi$ due to the Faraday effect. They modify the expression for the optical power P of the resulting beam as follows:

$$P = P1 + P2 + 2\sqrt{P1.P2} \cos[\delta\Phi + \alpha \cos(2\pi f2 t + \beta)] \qquad (2)$$

where $\alpha$ is a coefficient representative of the depth of phase modulation.

Simultaneously, the optical power from the coherent light source 12 is sinusoidally amplitude modulated at a frequency f1 which is slightly greater than f2, varying the powers P1 and P2 of the light beam entering the interferometer as follows:

$$P1 = Po1 \, (1 + m \sin 2\pi f1 t)$$

$$P2 = Po1 \, (1 + m \sin 2\pi f1 t)$$

Where Po1 and Po2 are constants, and m is a depth of amplitude modulation such that the optical power P of the resulting beam output by the interferometer satisfies the relationship:

$$P = (1 + m \sin 2\pi f1 t)(Po1 + Po2 + 2\sqrt{Po1.Po2} \cos[\delta\Phi + \alpha \cos(2\pi f2 t + \beta)]) \qquad (3)$$

When this equation is analyzed mathematically by means of Bessel functions, it can be seen that the power P of the beam coming from the interferometer has a frequency spectrum which is very rich in harmonics, and which includes a ray at the frequency f1-f2, which ray can be isolated by filtering and demodulation, with the power P' of the ray being proportional to the sine of the phase shift $\delta\Phi$ due to the Faraday effect:

$$P' = \tfrac{1}{2} m \, Po \, J1 \, (\alpha) \sin \delta\Phi \sin[2\pi(f1 - f2)t + \phi] \qquad (4)$$

(where J1 is a Bessel function of the first kind and of order 1).

A frequency synthesizing generator 30 generates a control signal at the frequency f1 for amplitude modulating the power emitted by the light source 12, control signals at the frequency f2 for the phase modulator 18 and 19, and a clock signal at the frequency f1-f2 for the synchronous detection circuit 32.

The output signal from the optical detector 14 is injected, after amplification and filtering, to the input of the synchronous detector circuit 32 which is followed by an amplifier and filter circuit 33 which delivers an output signal s(t) which conveys the current to be measured with maximum sensitivity in the small current range since the amplitude of the signal is proportional to the sine of the phase shift angle generated by the Faraday effect, and consequently to the sine of the current I1 to be measured:

$$s(t) = k2 \sin(k1 \, I1 \sin wt) \qquad (5)$$

$$I1 \sin wt = (1/k1) \, \text{Arc} \sin(s(t)/k2) \qquad (6)$$

This double modulation technique allows synchronous demodulation to be performed at a frequency f1-f2 which is much lower than the natural frequency of the interferometer, thereby providing two advantages: the physical implementation of the detector can be simplified and the length of the monomode optical fiber 10 in the interferometer loop can be minimized, which is advantageous since the fiber is naturally sensitive to mechanical disturbances and these give rise to propagation mode coupling.

This also makes it possible to standardize the difficult signal processing portion located downstream from the synchronous detector circuit 32 by maintaining the intermediate frequency fo constant even when the length of the fiber varies from one apparatus to another, giving rise to a change in the natural frequency of the interferometer, since this variation which gives rise to a variation in the phase modulation frequency f2 can be compensated by a corresponding variation in the amplitude modulation frequency f1.

Figure 2:
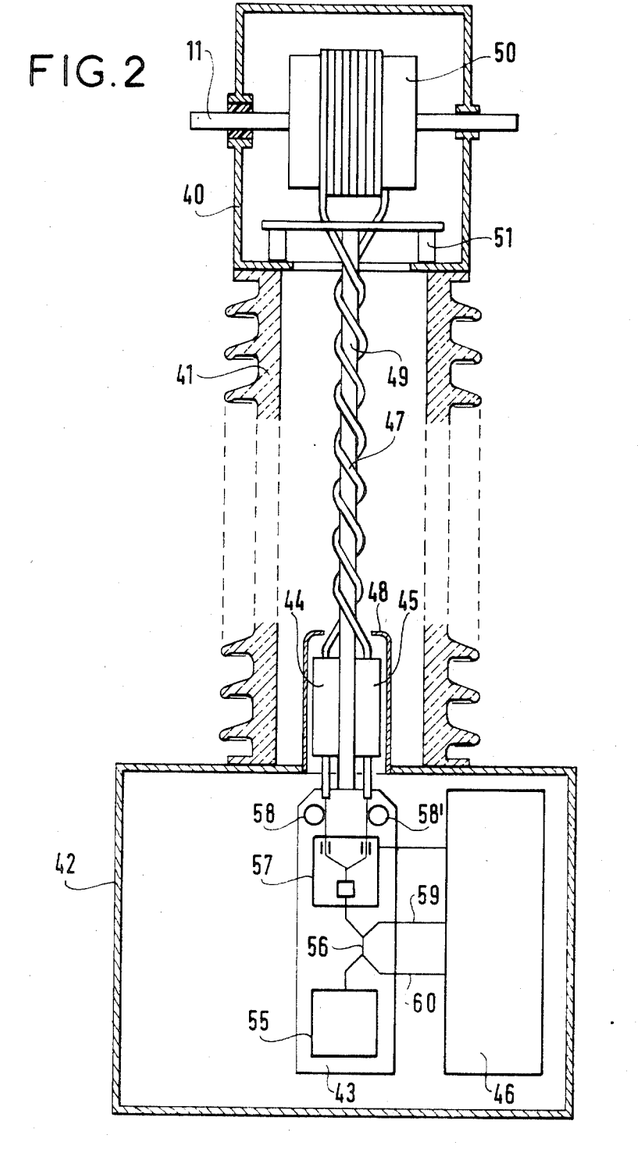
FIG. 2 shows a practical disposition for the components of the FIG. 1 measuring apparatus.

FIG. 2 shows the preferred disposition of the components of the current measuring device for application with alternating electric current lines operating at high tension. FIG. 2 shows a measurement head 40 supported by an insulating column 41 and a bottom support 42.

The measurement head 40 and the insulating column 41 delimit a hollow inside volume which is designed to provide the high degree of electrical insulation required for high tension apparatuses, for example it may be filled with a gas such as sulfur hexafluoride $SF_6$, with the insulating column 41 itself being made of porcelain or of a synthetic material.

The bottom support 42 for the insulating column 41 contains an optical support 43, two auxiliary electric coils 44 and 45 whose function is explained below, and an electronic circuit 46.

The column 41 essentially contains a central insulating pole 49 having an insulating cable 47 containing the optical fiber wound helically thereabout, with both ends of the cable terminating in the bottom support 42 and with an anti-corona metal partition 48 providing electrostatic screen for the auxiliary electrical coils 44 and 45.

The measurement head 40 encloses a sleeve 50 which surrounds an electrical conductor 11 conveying an alternating electric current which is to be measured, and the middle portion of the insulating cable 47 containing the optical fiber is wound thereabout. The sleeve 50 is fixed to the housing of the measurement head by means of a shock-absorbing device 51 which provides mechanical filtering of vibrations.

The insulating cable 47 encloses a monomode optical fiber having very low intrinsic birefringence, which fiber is twisted about itself so as to acquire very high circular birefringence and it is kept in condition by being coated with a silicone gell which constitutes an excellent dielectric and a good absorber of mechanical vibrations. This optical fiber which constitutes the Sagnac interferometer loop leaves the optical support 43 located in the bottom support 42, passes rectilinearly through the auxiliary electric coil 44, winds helically around the central pole 49 up the insulating column 41, reaches the measurement head 40 where it is turned several times around the insulating sleeve 50, then winds again around the central pole 49 in the insulating column 41 prior to returning to the bottom support 42 and passing rectilinearly through the auxiliary electric winding 45 prior to returning to the optical support 43.

The optical support 43 contains the light source 55, a linear polarization monomode directional coupler 56, a circuit 57 in integrated optical technology for performing the functions of the polarizer, the directional coupler, and the phase modulator, and finally two loops of optical fiber 58 and 58' which act as quarter-wave plates. It is housed in a thermostatically controlled enclosure providing climatic and mechanical protection, and it is optically connected to the electronic circuit 46 via multimode optical fibers which constitute the two output branches 59 and 60 from the directional coupler, said links being provided by multimode fibers since the only useful information conveyed thereby is light power information. An electrical connector serves to connect the electrical controls of the integrated optical technology circuit 57 and of the light source 55 to the electronic circuit 46.

Figure 3:
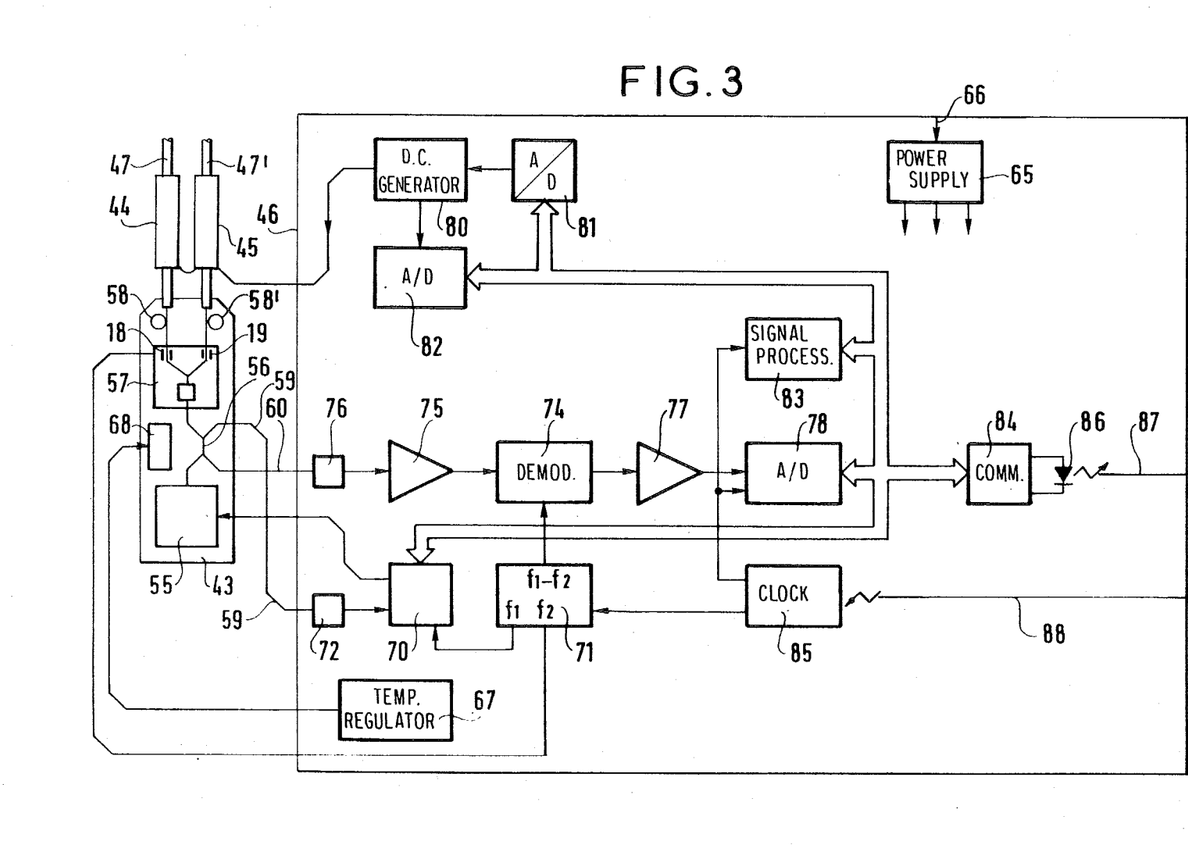
FIG. 3 is a block diagram showing details of the signal processing electronic portion of the FIG. 1 measurement apparatus.

FIG. 3 is a detailed view of the electronic circuit 46 and of its connections with the optical support 43.

The electronic circuit 46 comprises: a send portion generating the electrical signals required for providing both amplitude modulation and phase modulation of the two counter-propagating light waves running through the interferometer, a receive portion for extracting a signal proportional to the sine of the current to be measured from the beats between the two counter-propagating light waves that leave the interferometer; an automatic calibration portion; a portion for digitally processing the received signal and also for controlling the automatic calibration portion and transmitting the current measurement result to the outside of the device while optionally synchronizing said measurement with an external time reference; and a service portion comprising an electricity power supply 65 for the electronic circuit 46 and temperature regulation for the optical support 43.

The power supply 65 for the electronic circuit 46 is of the chopper type. It delivers the various bias voltages required and it provides considerable metallic isolation between the electronic circuit 46 and an electrical cable 66 coming from an external D.C. power supply.

Temperature regulation of the optical support 43 is ensured by a regulation block 67 coupled to temperature measuring components and heating components 68 which are integrated in the optical support 43.

The send portion includes a modulator 70 for modulating the power of the light source 55 and a frequency synthesizing generator 71. The modulator 70 is stabilized by a feed-back loop including a photodetector 72 connected to the optical fiber 59 which constitutes the output from the directional coupler 56 associated with the light source 55. It is provided with a modulation carrier input coupled to an output from the frequency synthesizing generator 71, and an inhibit input connected to the processor 83 of the portion for digitally processing the signal in the receive portion.

The frequency synthesizing generator 71 has a first output on which it delivers a frequency f1, and connected to control the power modulator 70, it has a second output on which it delivers a frequency f2 for controlling the optical phase modulators of the integrated optical technology circuit 57, and a third output on which it delivers a frequency (f1-f2) to a synchronous demodulation circuit 74 of the receive portion. It has a synchronization input controlled by a clock circuit 85 of the portion for digitally processing the received signal.

The receive portion comprises a synchronous demodulator circuit 74 preceded by an amplifier and filter circuit 75 connected to the output from a photodetector 76 connected to the optical fiber 60 which constitutes the output from the directional coupler 56 coupled to the interferometer, and followed by another amplification and filter circuit 77 and an analog-to-digital converter 78.

The photodetector 76 which receives the beats between the two counter-propagating light beams from the interferometer delivers an output signal which is proportional to the receive light power, which because of the amplitude modulation at frequency f1 and the phase modulation of frequency f2 can be expressed, as seen above at equation (3), by the following equation:

$$P = (1 + m \sin 2\pi f1 t)(Po1 + Po2 + 2\sqrt{Po1.Po2} \cos [\delta\Phi + \alpha \cos (2\pi f2 t + \beta)])$$

This signal is filtered and amplified by the circuit 75 in order to extract a component at the frequency f1-f2 which is proportional to the following (equation 4):

$$P' = \tfrac{1}{2} m \, Po \, J1 \, (\alpha) \sin \delta\Phi \sin [2\pi(f1-f2)t + \Phi]$$

and which, when applied to the synchronous demodulation circuit 76 and then filtered and amplified by the circuit 77 gives rise to a current measurement signal s(t) of the form (equation 5):

$$s(t) = k2 \sin k1\, I1 \sin wt$$

This signal is sampled and digitized by the analog-to-digital converter 67 which includes a sample-and-hold circuit under the control of the portion for digitally processing the receive signal, and an analog-to-digital converter device operating in conventional manner, for example by successive approximations.

The automatic calibration portion includes a D.C. generator 80 feeding the auxiliary coils 44 and 45 and receiving a D.C. current reference signal from the digital processing portion via a digital-to-analog converter 81 and delivering a measurement of the delivered current to the digital processing portion via an analog-to-digital converter 82 which includes a sample-and-hold circuit under the control of the digital processing portion.

The portion for digitally processing the received signal comprises a signal processing processor 83, a communications processor 84, and a clock circuit 85.

The signal processing processor 83 extracts an explicit measurement of the current to be measured I1 sin wt from the signal provided by the receive portion, and also controls the operation of the automatic calibration portion and provides periodic correction to the scale factor k2.

The communications processor 84 encodes, converts into serial form, and digitally transmits the instantaneous measurement of the current delivered by the signal processing processor 83 using a high security standardized protocol, for example of the HDLC type. This transmission to the outside takes place via a light-emitting diode 86 and a monomode or multimode optical fiber 87 which constitutes the output from the measurement apparatus.

The clock circuit 85 receives an external synchronization signal via an optical fiber 88. It synchronizes the operation of the signal processing processor 83 and the communications processor 84 together with the sampling as performed by the analog-to-digital converters 78 and 82, with all of said operations being synchronized on the external synchronization signal, thereby enabling a plurality of measurement apparatuses to be used together in parallel for a multiphase electrical grid in which it is important for the instantaneous measurements of current in each of the phases to be simultaneous. It also delivers a stable clock signal for use by the frequency synchronizing generator 71 in the send portion in order to generate the modulation carriers at frequencies f1 and f2 together with the demodulation carrier at frequency f1-f2 all at appropriate phase positions to ensure that the synchronous demodulation circuit 74 operates properly.

In order to explicitly extract the instantaneous value of the alternating current to be measured from the signal s(t), the signal processing processor 83 performs the following calculation:

$$(1/k1)\, \text{Arc sin}\, (s(t)/k2)$$

by means of a definition table for the arc sine function, the values of the factors k1 and k2, and an appropriate algorithm.

The value of the Faraday effect efficiency factor k1 for the current to be measured depends, as explained above, on the fundamental parameters V (Verdet constant), and N (number of turns performed by the light waves around the conductor conveying the current to be measured), which fundamental parameters may vary. The value of the factor is established by initial calibration of the measurement chain.

The value of the scale factor k2 is sensitive to drift in the various components of the measurement chain, and in particular to variations in the light power emitted by the source 55. It is subjected to a zero drift error $\epsilon O$ and a ratio drift error $\epsilon 1$ such that the exact value of the instantaneous current to be measured, is in fact:

$$(1/k1)\, \text{Arc sin}\, [s(t) - \epsilon O)/(k2 - \epsilon 1)]$$

The zero drift error $\epsilon O$ may be thought of as being the D.C. component of the signal s(t) in the receive portion insofar as the A.C. current does not have a D.C. component. It is then determined by the signal processing processor 83 by digitally filtering the signal s(t) over a short duration during which the A.C. to be measured is assumed to be free from any D.C. component (for example, in a high tension current step-down system when it is less than 1.2 In), and it is undated at a low rate compared with the frequency of the alternating current to be measured. In the example mentioned above, it is determined by digitally filtering the signal s(t) over a duration of about 1 to 2 seconds at a recurrence frequency of 0.001 Hz which is very low compared with the 50 Hz or 60 Hz frequency of an A.C. grid.

Although this method of determining the zero drift error $\epsilon O$ is suitable for monitoring fault D.C. components in an A.C. current to be measured by monitoring the amplitude of the error $\epsilon O$, it is preferred in the context of the measurement apparatus described, and more generally in the context of any apparatus which modulates the light waves conveyed by the interferometer, to use a different method which is unaffected by any possible D.C. components. In such measurement apparatus, the output signal is generated from a line at a frequency which is greater than that of the alternating current to be measured, which line is isolated from the light power spectrum of the beam coming from the interferometer. This line can be eliminated by switching off the modulation in order to cause a residual value to appear at the output which is due solely to the zero drift of the components in the measurement chain.

In this other method of determining zero drift error $\epsilon O$, the signal processing processor 83 stops measuring the instantaneous value of the current to be measured for a short period of time and switches off the amplitude modulator 70, thereby causing the signal s(t) to disappear from the receive portion since this signal is proportional to the amplitude modulation index m (equation 4), and to cause a residual value to appear corresponding to the zero drift error $\epsilon O$ of the various components in the measurement chain. During this short period of time, the signal processing processor 83 transmits instantaneous current values for the alternating current to be measured as stored over a preceding period to the communications processor 84. This short duration interruption in the measurement can be tolerated since it takes place at a very low recurrence frequency compared with the period of the alternating current to be measured and only when normal conditions apply such that the lack of any high value for the detected current minimizes the risk of a line fault appearing.

The ratio error $\epsilon1$ is eliminated by means of a periodic updating method which the signal processing processor 83 implements simultaneously with calculating the instantaneous value of the current to be measured, except for period during which the average value of the current to be measured is greater than a value which is taken to be critical, for example 1.2 times its nominal value, said critical value being selected in such a manner that the phase difference angle $k1\,I1$ due to the Faraday effect does not exceed about 10°.

Each time the scale factor $k2$ is being updated, the signal processing processor 83 determines the peak value $I1$ of the alternating current to be measured and then uses the automatic calibration portion to cause two successive disturbances of different amplitudes by injecting a test D.C. current into the auxiliary coils 44 and 45 at two different current values $I21$ and $I22$. Thereafter it extracts the D.C. components $so1$ and $so2$ from the outer signal $s(t)$ in the receive portion which components appear in response to these two disturbances, and it deduces the update value $k2-\epsilon1$ of the scale factor on the basis of the values of these D.C. components $so1$ and $so2$, from the peak value of the current to be measured $I1$ calculated using the old value $k2$ of the scale factor, and from the two currents $I21$ and $I22$ of the test D.C.

The signal processing processor 83 determines the peak value $I1$ of the alternating current to be measured, for example, by averaging the maximum detected current values over several periods of the current.

The auxiliary coils 44 and 45 are connected in series so as to give rise to additive non-reciprocal birefringence effects in the interferometer loop, and their Faraday effect efficiency coefficient is a function of the numbers of turns therein. Except when being used for periodically updating the value of the scale factor, they have no current flowing therein and the signal processing processor 83 switches off the D.C. generator 80 of the automatic calibration portion by applying thereto a zero reference value for the D.C. current.

Figure 4:
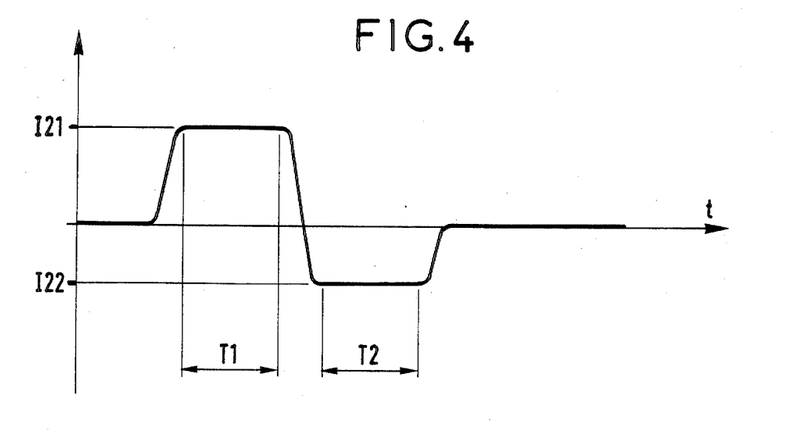
FIG. 4 is a graph showing the operation of an automatic calibration portion for the signal processing electronic portion shown in FIG. 3.

During the first disturbance of a scale factor updating cycle, which takes place during a time T1 which is long enough to enable the component $so1$ of the signal $s(t)$ in the receive portion to be filtered digitally, the signal processing processor 83 applies a current reference value to the current generator 80 of the automatic calibration portion which ensures that a D.C. current of value $I21$ flows through the auxiliary coils 44 and 45, as shown in FIG. 4. By virtue of the Faraday effect, this gives rise to a phase difference $\delta'\Phi$ between the two counter-propagating waves travelling around the interferometer loop which is added to the phase shift $\delta\Phi$ due to the alternating current to be measured in order to give rise to a total phase difference equal to:

$$\delta\Phi+\delta'\Phi=k1\,I1\,\sin\,wt+k3\,I21$$

At the output from the receive portion, i.e. from the analog-to-digital converter 78, this gives rise to a signal $s(t)$ of the form:

$$s(t)=\epsilon0+(k2-\epsilon1)\sin[k1\,I1\,\sin\,wt+k3\,I21]$$

in which the direct component is expressed by:

$$so1=\epsilon0+(k2-\epsilon1)\,JO\,(k1\,I1)\,\sin\,(k3\,I21)$$

where JO is the zero order Bessel function of the first kind.

During the second disturbance of the scale factor updating cycle, which takes place during a time T2 which is likewise long enough to enable the D.C. component $so2$ of the receive portion signal $s(t)$ to be digitally filtered, the signal processing processor 83 applies a different current reference value to the current generator 80 of the automatic calibration portion causing the auxiliary coils 44 and 45 to have a direct current of value $I22$ flowing therethrough, as shown in FIG. 4, in the opposite direction to the current $I21$ of the first disturbance, and having a different absolute value (since equality is difficult to achieve with accuracy and is, in any case, not necessary). This second D.C. $I22$ gives rise, in the same manner as the first D.C. $I21$, to the appearance of a direct component $so2$ in the output from the analog-to-digital converter of the receive portion which is expressed by:

$$so2=\epsilon0+(k2-\epsilon1)\,JO\,(k1\,I1)\,\sin\,(k3\,I22)$$

The difference between the two D.C. components $so1$ and $so2$ is not sensitive to the zero drift error $\epsilon0$ and is related to the exact value of the scale factor by the equation:

$$k2-\epsilon1=(so1-so2)/(JO(k1.I1)[\sin\,(k3\,I21)-\sin\,(k3\,I22)])$$

The signal processing processor performs this calculation by means of an appropriate algorithm.

It may be observed that the accuracy with which the magnitude $k1\,I1$ is determined has little effect on the measurement where its value does not exceed about 10° since, in this range of variation, the zero order Bessel function of the first kind has a low slope. The same is not true for the accuracy with which the D.C. test currents $I21$ and $I22$ are determined, which is why the signal processing processor 83 does not make use of the reference values it applies, but makes use of values actually measured as delivered thereto by the analog-to-digital converter.

The automatic calibration method described above is particularly advantageous for a step-down measurement apparatus constituted by two current measuring apparatuses of identical structure and operation but having different sensitivities, i.e. having different numbers of optical fiber turns around different potentials. In this case it becomes possible to transmit the instantaneous current measurements from one of the apparatuses to the output of the other during the time required for resetting its zero, and vice versa.

I claim:

1. A method of updating the scale factor of a current measuring apparatus for measuring an alternating electrical current by means of the Faraday effect implemented in an interferometer which delivers an output light beam whose optical power includes a frequency spectrum component which is proportional, by a scale factor $k2$, to the sine or the cosine of the phase difference generated by the Faraday effect on the light waves travelling through the interferometer, said phase difference itself being proportional to the instantaneous value of the current to be measured as multiplied by a Faraday effect efficiency factor $k1$, said light beam being received by a photodetector and said component being extracted therefrom by associated electronics in order to constitute an output signal s(t) from the interferometer, said method consisting in:

determining the peak value I1 of the alternating current to be measured from the output signal s(t) from the interferometer, from the value k1 of the Faraday effect efficiency coefficient for the alternating current to be measured and the available value k2 of the scale factor;

causing two successive disturbances of different amplitudes by adding an auxiliary Faraday effect to the Faraday effect due to the alternating concurrent to be measured, said auxiliary Faraday effect being generated by a test drive current which successively takes on two distinct values I21 and I22 which are different from zero and which are applied with a Faraday effect efficiency factor k3;

storing the direct components so1 and so2 of the output signal from the interferometer in response to the above two disturbances; and adopting a new scale factor k2 given by the expression:

$$(so1-so2)/(JO(k1.I1)[\sin(k3\ I21)-\sin(k3\ I22)])$$

where JO is the zero order Bessel function of the first kind.

2. A method according to claim 1, wherein said successive disturbances generated by adding an auxiliary Faraday effect to the Faraday effect due to the alternating current to be measured, are caused by a test D.C. current which successively takes on two distinct current values I21 and I22 flowing through at least one auxiliary electric coil which modifies the magnetic field acting on the interferometer loop and which is electrically isolated from the conductor conveying the alternating current to be measured.

3. A method according to claim 1, applied to an interferometer current measuring apparatus fitted with light wave modulators giving a frequency to said component which is higher than the frequency of the alternating current to be measured, said method additionally including the step of periodically switching off said modulator in order to switch off said component and cause a residual value to appear in the output signal s(t) from the interferometer, said residual value corresponding to the zero drift error $\epsilon O$ in said output signal, with account being taken thereof for correction purposes each time it is used.

4. A method according to claim 1, applied to an interferometer current measuring apparatus equipped with an amplitude modulator operating on the light power emitted by the source which delivers the light beam giving rise to the waves travelling through the interferometer, and giving a frequency to said component which is higher than the frequency of the alternating current to be measured, wherein said method further includes the step of periodically switching off said amplitude modulator in order to switch off said component and cause a residual value to appear in the output signal s(t) from the interferometer, said residual value corresponding to the zero drift error $\epsilon 0$ in said output signal, with account being taken thereof for correction purposes prior to making use of said output signal.

* * * * *